United States Patent

Wisman

[15] 3,645,855

[45] Feb. 29, 1972

[54] ULTRASONIC REPAIR PLATING OF MICROSCOPIC INTERCONNECTIONS

[72] Inventor: Renee L. Wisman, Wappingers Falls, N.Y.

[73] Assignee: International Business Machines Corporation, Armonk, N.Y.

[22] Filed: Aug. 14, 1970

[21] Appl. No.: 63,878

[52] U.S. Cl. ....................204/16, 204/15, 204/222, 204/223, 204/224

[51] Int. Cl. ....................C23b 7/00, C23b 5/48, B23p 1/02

[58] Field of Search ....................204/222, 223, 15, 16

[56] References Cited

UNITED STATES PATENTS

| | | | |
|---|---|---|---|
| 2,978,388 | 4/1961 | Topfer | 204/16 |
| 2,980,829 | 4/1961 | Lawson | 317/234 |
| 2,980,594 | 4/1961 | Pankove | 204/15 |
| 3,056,938 | 10/1962 | Pappis et al. | 204/15 |
| 3,324,015 | 6/1967 | Saia et al. | 204/15 |
| 3,351,539 | 11/1967 | Branson | 204/223 |

*Primary Examiner*—John H. Mack
*Assistant Examiner*—T. Tufariello
*Attorney*—Hanifin and Jancin and Robert Lieber

[57] ABSTRACT

Plating equipment for special applications includes a point tipped ultrasonically agitated bonding tool adapted for electroplating. In the application process the tool receives continuous plating current and intermittent side-to-side ultrasonic agitation. In conjunction with commercial dry film photoresist masks and brush plating solutions the equipment is used to construct microscopic spot plating deposits. The equipment and method are especially useful for customized repair/rework or interconnection elements (vias) in printed circuit devices as a supplement to the basic mass manufacture process. Spot deposits made by this method are formed rapidly, well-adhered and comparable in overall quality to deposits produced on a mass manufacturing scale by conventional immersion plating techniques. Plating current and tool tip diameter critically affect plating quality.

4 Claims, 3 Drawing Figures

INVENTOR
RENEE L. WEISMAN

BY Robert Lieber

ATTORNEY

ULTRASONIC REPAIR PLATING OF MICROSCOPIC INTERCONNECTIONS

BACKGROUND OF THE INVENTION

1. Field of the Invention

The invention pertains to selective spot electroplating, especially by nonimmersion plating procedures.

2. Description of the Prior Art

It has been known for some time that speed of deposit formation in immersion electroplating processes can be improved by intermittent ultrasonic agitation of the plating fluid. However the known apparatus employing such agitation operates on a mass-manufacture scale in an immersion plating environment. Such apparatus therefore requires a sealed submersible unit, including a transducer and power connections, to couple agitation to the plating solution on a large scale. For small scale customized plating functions, as in spot repair/rework, these techniques are not directly adaptable.

The present invention concerns the method and apparatus improvement by which an unsealed point-tipped bonding device is adapted as a spot plating anode. The device is used to conduct continuous plating currents to a small drop of viscously confined plating solution while intermittently receiving ultrasonic agitation. The spot-plating deposit formed thereby has exceptional quality.

In the past small area plating has been accomplished by the conventional dalic (brush) plating method. Typically, a brushlike electrode surrounded by a porous covering, the latter saturated with a highly concentrated plating solution, is used to form small plating deposits. However, in my experience deposits on the order of 3 mils diameter tend to burn and/or adhere poorly when formed by the dalic method. The present apparatus and method have been devised specifically for use in plating on these dimensions to tenths of mils tolerances.

SUMMARY

According to the subject method a drop of dalic plating solution is confined to a small area covering and filling the space to be plated. The confining medium is a thick film resist mask with a stopoff lacquer painted over sufficiently plated deposits. Plating is accomplished by a tapered point-tipped tungsten carbide bonding element used as a plating anode (tip diameter, which is critical, should not exceed 0.002 inch).

The anode is positioned with the tip just contacting the solution above the microscopic area to be plated. While receiving continuous electrical plating current and intermittent pulsations of ultrasonic agitation the anode system forms plating deposits of microscopic size (e.g., 0.002-inch diameter; 0.003 inch height) and high quality.

Plating quality is critically dependent upon plating current, anode tip diameter and anode agitation. For 3 mil diameter deposits a current in the 140 to 180 microampere range is suitable. For larger deposits on the order of 8 mils diameter the current can be increased up to 200 microamperes to speed deposit formation. When the current is allowed to exceed 200 microamperes undesirable nodules begin to form upon the photoresist mask surface.

The ultrasonic anode agitation is coupled in a direction crosswise to the anode axis. A tapering horn structure serves as the coupling medium between the agitation source and the anode. During the plating time of about 8 minutes required to form deposits equal in thickness to the surrounding dry film resist the ultrasonic agitation is applied intermittently at 10 to 15 second intervals for duration of about 500 to 1,500 milliseconds.

Foregoing and other features and objectives of this invention are clarified in the following description of the preferred applicational embodiment.

DETAILED DESCRIPTION OF A PREFERRED EMBODIMENT

In a preferred application the present invention is employed conditionally in the repair stage of a quality-controlled process for constructing multilayer printed circuit devices. The overall process includes a mass plating stage. The general process flow sequence is:

prepare specimens for mass plating by application, exposure and processing of thick dry film photoresist mask; areas to be plated have conductive surfaces with electrical continuity to back-surface for common cathodic connection of plating voltage;

plate multiple deposits (40 minutes) by standard immersion process; deposits form relief microstructures to serve as conductive connections (vias) to yet to be formed layers of circuitry;

inspect for missing or poorly formed vias;

if no vias are missing remove (dissolve) photoresist mask and sections of conductive layer supporting deposit, and continue additive processing of circuit layers (build insulative layer to height of plated via deposits, laminate conductive foil layer, form wiring pattern, etc.);

if vias are missing retain photoresist mask and repair by subject method and equipment as described below;

after repair remove photoresist mask and continue additive layer processing as above.

Figure 1:
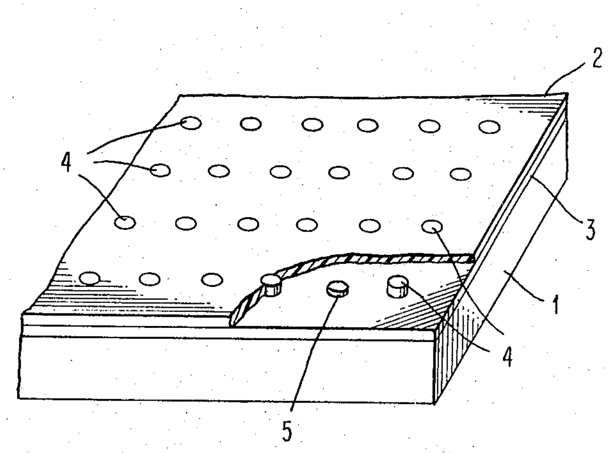
FIG. 1 is a schematic of a partially fabricated printed circuit board at a stage of processing at which the present invention may be used to advantage.

Interconnection vias for partially constructed multilayer modules 1 (FIG. 1) are fabricated by laminating a thick film photoresist 2 (e.g., duPont's Riston) to a conductive lamination 3. The resist film is photoprocessed to form a relief mask pattern. Copper via deposits 4 are then plated through openings in the resist mask to a height equal to resist thickness. A conventional $CuSO_4$, $H_2SO_4$ immersion plating bath is used.

Cathodic plating voltage is connected to all plating sites through connections between the underside of the part 1 and an external source. Parts are designed to have internal conduction continuity between conductive layer 3 and the underside surface.

Plating requires about 40 minutes. After plating the ordinary procedure would be to chemically remove the resist mask and the parts of the common conduction layer 3 which are not covered by via platings. In instances where the invention is applied this ordinary procedure is deferred.

Typical modules have from 400 to 5,000 vias per layer and a complete module contains four layers. On any layer a few vias may not plate due to incomplete photoresist development, air bubbles forming over the holes, dust, or other factors. If suitable spot plating procedures were not available a defect could be repaired only by removal and reprocessing of the last constructed layer. This is a time-consuming and costly operation.

In regard to spot plating it has already been observed that the conventional brush plating methods are subject to the tendency to produce burnt, nonadherent deposits. Accordingly the preferred method of repair is the subject process as described next.

The subject repair process begins with an inspection of the module after the mass plating stage. Missing or defective vias such as 5 (FIG. 1) are easily detected. Modules with missing vias are prepared for repair with the photoresist mask layer 2 preserved.

Figure 2:
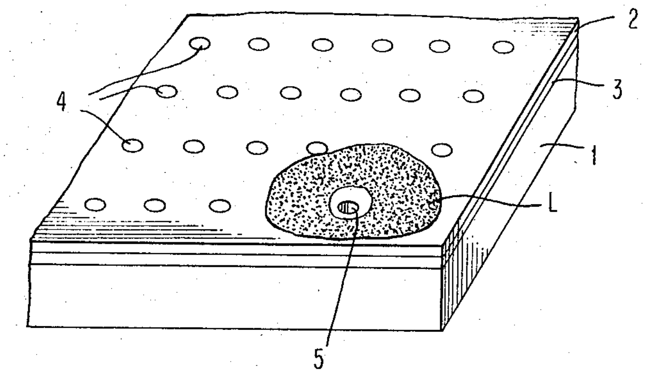
FIG. 2 indicates the stopoff preparation of the board shown in FIG. 1 for subject plating application.

The area adjacent to the intended plating site of the via 5 is painted with a stopoff lacquer L (Warnow black lacquer) as suggested in FIG. 2. This protects neighboring correctly plated vias 4.

Next, the module is thoroughly cleansed using the following steps:

| | |
|---|---|
| * Immerse in Neutraclean | —1 minute |

| | |
|---|---|
| * Rinse in deionized water | —1 minute |
| * Immerse in ammonium persulfate (10%) | —5 seconds |
| * Rinse in deionized water | —1 minute |
| * Immerse in sulfuric acid (10%) | —1 minute |
| * Rinse in deionized water | —1 minute |

Figure 3:
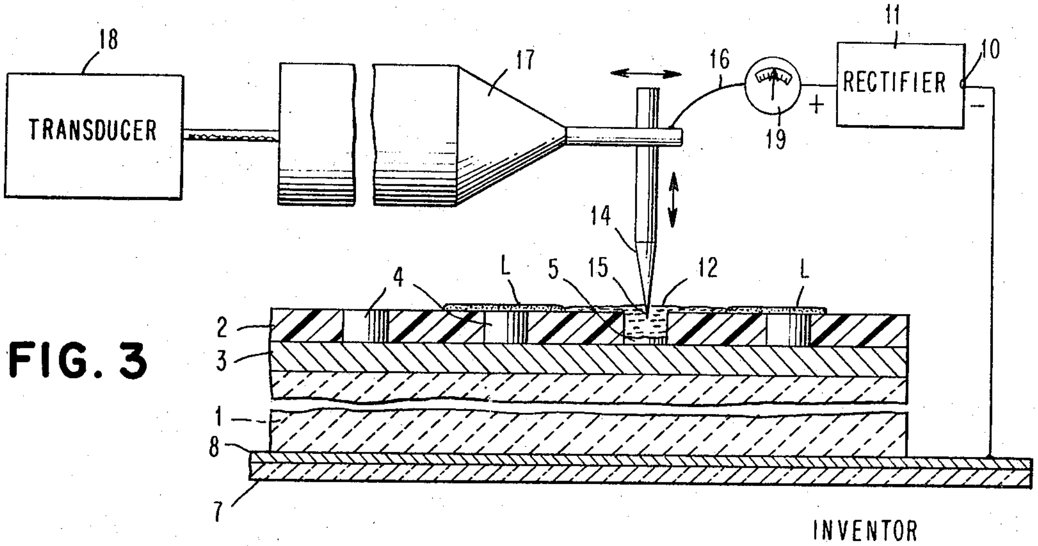
FIG. 3 indicates schematically the equipment used in the subject procedure.

Repair plating is accomplished with the apparatus shown in FIG. 3. Plating sites underlying defective vias 5 are connected to cathodic plating voltage through the backside of the part. To accomplish this I tape the module part to a sheet 7 of G10 epoxy glass. The sheet has a larger area than the module and the upper surface of the sheet which contacts the under surface of the module is coated with a surface layer 8 of copper. Negative terminal 10 of the rectifier 11 is attached to copper layer 8 to make connection to repair plating sites 5.

I now place a drop of dalic plating solution, for example the preparation sold by Sifco Metalchemical as code 2055, in the opening bounding the intended plating site. The part is examined under a 30X microscope and air bubbles are expelled from the drop 12 with a 2-mil wire.

Now I position the taped assembly beneath ultrasonic bonding tool 14. The tool tip 15 need not be directly over the center of the plating site but it should just contact the upper surface of the solution in drop 12. Upon securing the taped assembly in place by a clamp (not shown), anode wire 16 is coupled to tool 14 through a conductive section of the transducing horn 17 and plating is initiated.

The current used for a three mil diameter via is critically confined to the range between 140 and 180 microamps. An 8-mil diameter via can be plated at 200 microamperes. The solution completely fills the resist mask hole. Tool 14, which receives pulsed ultrasonic vibrations from transducer 18 every 10–15 seconds, provides solution agitation in addition to serving as the plating anode. A low power and long pulse length provide sufficient agitation, but the settings vary from transducer to transducer. The stopoff lacquer L prevents adjacent vias from contacting the solution and being overplated.

The entire plating process, which requires about 8 minutes, is periodically observed under a 30X microscope. When the plating has reached the resist mask height, the current is turned off and the part is rinsed in deionized water. The repaired module is then returned to the production line, where the stopoff lacquer L is removed by the photoresist stripping solution.

Diametric dimensions of tip 15 are critical. Tip diameter should not exceed 0.002 inch. With specified currents tips having larger diameters produce deposits of poor quality (burning at deposit sites; nodule formation on resist surface).

Plating currents indicated by microammeter 19 are also critical. If allowed to exceed 200 microamps, nodules form upon the resist mask surface irrespective of the via opening dimensions.

Several incomplete vias in a common area can be plated at the same time by simply stopping off only the correctly formed vias in the area, thereby confining the dalic solution to the resist openings corresponding to the incomplete vias.

Repaired vias constructed by this method perform well in all reliability tests. Via adhesion ranges from 10,000 to over 50,000 lb./in.$^2$ which is comparable to, or better than, immersion-plated vias. Outgassing tests suggest that repaired plated vias covered by deposits of glass, as required to construct additional circuit layers, do not have entrapped gasses. In general no significant difference has been noted between immersion plated vias and those formed by the present method.

THEORETICAL BACKGROUND

The rate of electrodeposition of a metal is determined by the current density across the part to be plated. The higher the current density, the more rapid the deposition but there is a maximum current density at which metal deposition can be the principal process occurring at the anode. Within limits, with increased current deposition crystal size decreases but if a limiting value of current is exceeded rough or burnt deposits result. The theoretical limiting current density (which is considerably higher than that actually attainable) is controlled by the rate of supply of metal ions to the cathode film. This is given by the equation:

$$I=D.n.f.c./\delta(1-\alpha)$$

where $D$ = diffusion coefficient of the Cu salt
$n$ = number of electrons involved in transfer process
$F$=96,500 coulombs
$C$ = concentration of metal ion
$\delta$ = thickness of cathode film
$\alpha$ = transport number of metal ion Thus, in order to obtain a rapid rate of deposition, the following conditions are desirable:

The concentration of electrolyte should be high. However, highly concentrated solutions have increased cost—both initially, and due to dragout. They also tend to crystallize and may be too viscous.

The thickness of the cathode film should be minimal. The reason for the formation of such a film is as follows: In an acid copper solution, both H+ and Cu++ ions migrate to the cathode. The Cu++ ions are more easily discharged than H+ so the current efficiency is close to 100 percent for copper. However, less copper is brought to the cathode by migration than is deposited, resulting in a layer of solution at the cathode surface than is weaker in Cu++—the cathode film. A minimal thickness of this film is achieved by maximum agitation of the metal salt solution over the cathode.

The transport number of the metal salt should be large (i.e., most of the current should be carried by the metal ions). This is achieved by having no other cations present.

In the subject ultrasonic plating apparatus, the limiting current is maximized. The solution concentration is very large compared to conventional immersion plating baths. High-speed dalic solution contains 145 g. Cu++/1; conventional baths contain less than 63 g. Cu++/1. Delta ($\delta$) is minimized by providing maximum agitation through the anode and ultrasonics. Thus, current densities used in the present ultrasonic plating method can be as high as 2,800 amps/ft.$^2$ compared to 30–50 amps/ft.$^2$ in immersion plating, and the time required to plate a 3-mil thick via deposit is 8 minutes compared to 40 minutes by the batch immersion process.

We have shown and described above the fundamental novel features of the invention as applied to several preferred embodiments. It will be understood that various omissions, substitutions and changes in form and detail of the invention as described herein may be made by those skilled in the art without departing from the true spirit and scope of the invention. It is the intention therefore to be limited only by the scope of the following claims.

What is claimed is:

1. A method of constructing a custom plating deposit of microscopic size upon an object containing a small area conductive plating site exposed through an opening in a photoprocessed photoresist mask comprising:

securing said object;

coupling negative potential, of a current limited plating current supply, to said plating site;

placing a drop of dalic plating solution in said mask opening;

positioning a point tipped plating anode having a tip diameter not exceeding 0.002 inch with the tip just contacting the surface of said dalic solution drop;

coupling positive potential of said plating current supply to said anode to complete a plating circuit path through said anode tip, solution drop and plating site;

coupling intermittent pulsations of ultrasonic vibration agitation to said anode in a direction perpendicular to said tip.

2. In an electroplating process for producing a microscopic-area plating deposit upon a conductive surface of an electronic part, said surface covered by a mask outlining the microscopic-sized area of said surface which is to receive said deposit, the steps of:

placing a drop of dalic plating solution on said part surface in said outlined area;

contacting the surface of said drop with the tip of an ultrasonic welding tool; said tip having diameter of at most 0.002 inches; and concurrently applying pulses of ultrasonic vibrations to said element and circulating a DC current of at most 200 microamperes through the series circuit of said element, said drop and said part surface; said vibrations and current being controlled to cause a deposit to form rapidly on said part surface, said deposit characterized by uniform quality and tight adhesion to said part surface.

3. In a method according to claim 2 the additional steps of: intermittently displacing said element and visually observing growth of said deposit in said outlined area through suitable optical magnification; and terminating operation of said element when said observed deposit reaches a predetermined height.

4. In an electroplating process for producing multiple microscopic spot deposits of conductive material on a resist-masked conductive surface of an electronic part the procedure for repairing defectively formed deposits prior to stripping the resist mask comprising the steps of:

covering correctly formed deposits outlined by said resist mask with a stopoff lacquer;

cleaning the masked part thoroughly;

adapting the masked part to permit it to receive connection of electrical potential and to conduct said potential to the said masked conductive surface;

placing a drop of dalic plating solution over a defective plating site on said part surface outlined by said mask and, intermittently;

placing the top of an ultrasonic welding element—tip diameter at most 0.002 inch—in contact with the surface of said drop while coincidentally applying ultrasonic vibrations to said element and circulating a regulated DC electric plating current of at most 200 microamperes through the series electrical circuit formed by said element, said drop and said part surface; and visually observing growth of plating at said site through optical magnification and terminating the plating operation of said element when the plating growth formed by the operation of said element is observed to be level with the surface of the mask.

* * * * *